United States Patent
Hughes

(10) Patent No.: US 8,006,144 B2
(45) Date of Patent: Aug. 23, 2011

(54) MEMORY TESTING

(75) Inventor: Paul Stanley Hughes, Cambridge (GB)

(73) Assignee: ARM Limited, Cambridge (GB)

( * ) Notice: Subject to any disclaimer, the term of this patent is extended or adjusted under 35 U.S.C. 154(b) by 782 days.

(21) Appl. No.: 11/808,258

(22) Filed: Jun. 7, 2007

(65) Prior Publication Data

US 2008/0010567 A1 Jan. 10, 2008

(30) Foreign Application Priority Data

Jul. 7, 2006 (GB) .................................. 0613557.8

(51) Int. Cl.
*G11C 29/00* (2006.01)
*G01R 31/28* (2006.01)

(52) U.S. Cl. ........................................ 714/718; 714/733

(58) Field of Classification Search .................. 714/718, 714/724, 726, 732, 733, 734, 736; 365/200, 365/201

See application file for complete search history.

(56) References Cited

U.S. PATENT DOCUMENTS

| | | | | |
|---|---|---|---|---|
| 5,469,445 A | * | 11/1995 | Nicolaidis | 714/726 |
| 5,495,491 A | * | 2/1996 | Snowden et al. | 714/764 |
| 5,918,248 A | * | 6/1999 | Newell et al. | 711/147 |
| 6,415,406 B1 | * | 7/2002 | Kaiser et al. | 714/733 |
| 2006/0212764 A1 | * | 9/2006 | Slobodnik et al. | 714/718 |

FOREIGN PATENT DOCUMENTS

| | | |
|---|---|---|
| GB | 2 265 023 A | 9/1993 |
| JP | 09-319729 | 12/1997 |
| JP | 2003-344489 | 12/2003 |

OTHER PUBLICATIONS

UK Search Report for GB 0613557.8, date of search Sep. 18, 2006.
Karpovsky et al., "Transparent Memory BIST", Proc IEEE int workshop Memory Tech Des., 1994, pp. 106-111.
Boutobza, et al. "A Transparent based Programmable Memory BIST", 11$^{th}$ European Test Symposium, May 21-24, 2006; pp. 89-96, IEEE Computer Society, 2006.

* cited by examiner

*Primary Examiner* — Jeffrey A Gaffin
*Assistant Examiner* — Daniel F McMahon
(74) *Attorney, Agent, or Firm* — Nixon & Vanderhye P.C.

(57) ABSTRACT

This application discloses a data processing apparatus comprising: at least one memory; processing logic operable to perform data processing operations on data and operable to access said at least one memory; and memory testing logic operable to perform a transparent algorithm testing routine on said at least one memory, said data processing apparatus impeding said processing logic from accessing said at least one memory while said memory testing logic is performing said testing routine; wherein said processing logic and said memory testing logic are operable to detect a system event, said memory testing logic being operable when performing said testing routine to respond to detection of said system event by stopping said testing routine and restoring said at least one memory to an initial state, said initial state being a state it was in immediately prior to commencement of said testing routine, whereupon said data processing apparatus is operable to allow said processing logic to access said at least one memory.

15 Claims, 3 Drawing Sheets

$$\{\Uparrow(rd)^M; \Downarrow(r/d)^M; \Updownarrow(rd)^M; \Uparrow(rd,w/d); \Downarrow(r/d,wd)^M; \Updownarrow(rd)\}$$

$$\{\Uparrow(rd)^M; \Downarrow(r/d)^M; \Updownarrow(rd)^M; \Uparrow(rd,w/d); \Downarrow(r/d,wd)^M; \Updownarrow(rd)\}$$

MEMORY TESTING

FIELD

The technology relates to the field of data processing systems, and more particularly, to the field of testing memory within data processing systems to detect memory defects.

BACKGROUND

It is known to provide data processing systems incorporating memories with self-testing mechanisms, sometimes termed built-in self-test (BIST), such that when the memory circuits have been fabricated they may conduct a self-test or series of self-tests to determine if there are any memory defects present that would indicate that the circuit should be rejected. It is important that memory circuits should be highly reliable and that defective circuits should be effectively identified. As memory sizes increase, the proportion of the die being taken up by the memory is also increasing and, furthermore, the high transistor density within memory means that the defect density of these memories is becoming increasingly significant.

A known technique which alleviates such problems is to provide the integrated circuit with a memory Built In Self-Test (BIST) controller. In simplistic terms, a memory BIST controller is an on-chip utility that enables the execution of a proven set of algorithmic style verification tests directly on the embedded memory. These tests involve sequences of reads and writes to different addresses in the memory. Seed data defined by the BIST controller is written to and read from each memory address. Each read is compared against the expected read data. These tests can be executed at the design's full operating frequency to prove the memory operations and identify errors caused by silicon defects.

Memory BIST can be used both at the time of fabrication and when the chip is deployed in the field and performing its designed function. In the latter circumstance the memory BIST is activated at regular intervals (say once a second) to ensure that no errors have occurred in the memory. An ABS system, for example, will regularly self-check the behaviour of the chip including the memories. This can be done using self-checking code or by using memory BIST. Processors connected to the memory under test will not be able to access the memory during the test and will therefore stop execution. It is therefore important that the test be performed quickly and efficiently so that the time that the processor is stopped for is minimised. It is also important that in the absence of faults the memory content immediately before and after the test is identical.

Transparent memory BIST algorithms have been developed to address this problem, they perform their tests using the data stored in the memory as seed data. This avoids the need to save and restore the data to another memory at the beginning and end of the test. Hence the tests can be performed more quickly. However, although these tests may be performed more quickly, the processor will still not be able to handle any interrupts received during the test but will have to wait until it is completed. This is a serious concern in real time systems where interrupt latency is a key requirement.

In this respect, a typical transparent BIST algorithm will access each address 15 times during the test, this is known as 15N. This gives a maximum interrupt latency of 15X (number of RAM addresses), and an average interrupt latency of half this.

A more complex algorithm such as 22N will have a proportionately longer maximum and average interrupt latency. It should be noted that for a cache data RAM, 512 is a typical value for N.

A transparent circular algorithm for testing both on and off-line embedded memories which provides for restoration of the content at the end is disclosed in Karpovsky and Yarmolik "Transparent Memory BIST", Proc IEEE int Workshop Memory Tech Des. Test, pp 106-111, 1994.

A known system involving the storing and restoring of state which is generally used in power down mode but can be used in memory BIST is disclosed in patent application GB02265023.

SUMMARY

A first aspect of the present invention provides a data processing apparatus comprising: at least one memory; processing logic operable to perform data processing operations on data and operable to access said at least one memory; and memory testing logic operable to perform a transparent algorithm testing routine on said at least one memory, said data processing apparatus impeding said processing logic from accessing said at least one memory while said memory testing logic is performing said testing routine; wherein said processing logic and said memory testing logic are operable to detect a system event, said memory testing logic being operable when performing said testing routine to respond to detection of said system event by stopping said testing routine and restoring said at least one memory to an initial state, said initial state being a state it was in immediately prior to commencement of said testing routine, whereupon said data processing apparatus is operable to allow said processing logic to access said at least one memory.

The provision of memory test logic that in addition to performing testing routines on memory can detect and respond to system events allows a potential source of latency in a system that tests memory during processing to be reduced. Providing memory testing logic that in response to detection of a system event such as an interrupt can act to stop the test and restore the state of the memory reduces the time that the processing logic is prohibited from accessing the memory and thereby reduces the time between the system event occurring and the processing logic responding to it. This is because the processing logic can react much more quickly to system events than would be the case, if it were prohibited from accessing the memory until after the test has run to completion.

A transparent algorithm uses the memory's initial data to derive the test pattern. A transparent test algorithm ensures that for every address the last write data is always equal to the first read value, thus the content of the memory is restored at the end of the procedure without the need to write it to a separate storage device. Thus, a transparent algorithm must not destroy the original data, but manipulates it in a known way such that the original data can be retrieved if the manipulations of the algorithm are known. This technique uses a transparent test algorithm so that the contents of the memory do not need to be saved to a separate location before the test and written back to the memory to restore its state at the end, which would be the case if a non transparent algorithm were used.

The processing logic can be a variety of different things, in some embodiments it is a processor whereas in others it is application specific logic, i.e. logic that is hard wired to perform a specific task rather than logic that responds to instructions.

In some embodiments, said testing logic is operable to detect a point during performance of said transparent algorithm where said memory is in said initial state and to stop performance of said transparent algorithm at this point.

It may be that during performance of the transparent algorithm the memory's initial state is at certain points in that performance restored. In such a case if the testing routine is stopped at this point no restoration of the memory's initial state will be required. Thus, it may be advantageous to stop the testing routine at such a point rather than stopping it immediately a system event is detected and then acting to restore the state.

In some embodiments, said transparent algorithm comprises indicators indicating a point in said algorithm when said memory will be in said initial state, said memory testing logic being operable to detect said indicators ands to stop performance of said transparent algorithm in response to said detection.

It may be that the transparent algorithm is written in such a way that markers are inserted within it to indicate where in that algorithm the memory will be in its initial state. In such a case, the testing logic detects these indicators and knows from this where to stop the testing routine at what is in effect a safe place.

In other embodiments, said testing logic is operable in response to detection of said system event to detect where in performing said testing routine said memory testing logic is and to determine a way to restore said initial state of said memory from this point and to restore said initial state by said determined way.

It may be quicker and more efficient to stop the testing procedure immediately and to restore the initial state of the memory rather than to wait for the initial state of the memory to appear somewhere during the testing procedure. The testing logic advantageously has the property of being able to determine where in the algorithm the testing procedure is and from that to determine how to restore the initial state of the memory.

Although the processing logic and memory can be formed in a number of manners, in some embodiments they are formed in an integrated circuit.

Testing of memory is often required on memories that are located along with processors on an integrated circuit. In such circumstances, system events such as interrupts are processed by the integrated circuit and are thus relevant for both devices located on this integrated circuit.

In some embodiments, said memory testing logic comprises a memory built in self test controller.

Memory built in self test controllers are commonly used to test memories during operation of testing logic. Thus, such self test devices suffer from many of the disadvantages addressed by embodiments of the present invention and thus, such systems are particularly applicable to the present technique.

Although the memory built self test controller can be formed outside of the integrated circuit it also can be formed on the integrated circuit. Depending on the requirements of the particular device, it may be appropriate to have the memory BIST either on or off the integrated circuit holding the memory being tested.

Although the system event can comprise a number of things, it commonly comprises an interrupt. An interrupt may occur due to a user pressing a keyboard, or a break being applied or even a timer passing a predetermined point.

In some embodiments, said processing logic and said memory testing logic are operable to receive said system event in parallel with each other.

If the configuration of the system is such that the memory testing logic receives the system event in parallel with the processing logic, then this enables the testing routine to be terminated and the memory restored particularly quickly and efficiently.

A further aspect of the present invention provides a method of testing at least one memory within a data processing apparatus, said data processing apparatus comprising a processing logic operable to access said at least one memory, said method comprising the steps of: initiating a transparent algorithm testing routine for testing said at least one memory; prohibiting said processing logic from accessing said at least one memory while said testing routine is being performed; detecting a system event; stopping said testing routine in response to said detected system event; restoring said at least one memory to an initial state, said initial state being a state it was in immediately prior to commencement of said testing routine; and allowing said processing logic to access said at least one memory.

A yet further aspect of the present invention provides a computer program product which is operable when run on the data processor to control the data processor to perform the steps of the method according to a further aspect of the present invention.

DESCRIPTION

Figure 1:
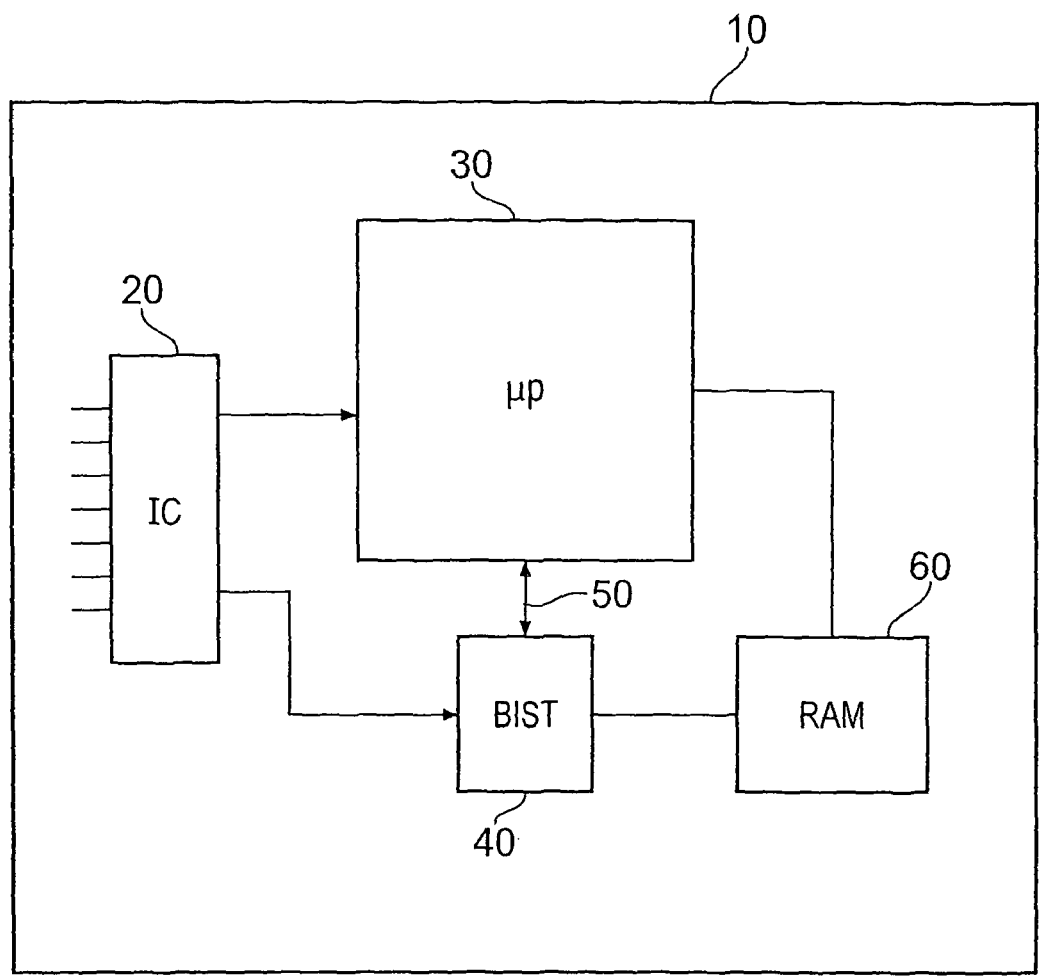
FIG. 1 schematically shows a data processing apparatus.

The data processing apparatus 10 of FIG. 1 comprises an interrupt controller 20 operable to receive external interrupts and to forward at least some of them to the processor 30 and the memory BIST controller 40. It will be appreciated that such an integrated circuit 10 will typically include many more circuit elements, but these have been omitted from this drawing for the sake of simplicity and clarity.

Microprocessor 30 is linked to memory BIST controller 40 by link 50. This link enables the microprocessor to communicate with the memory BIST controller 40. Thus, the processor 30 can instruct the controller 40 to start its testing of embedded memory 60 at a moment when it is in an idle state, for example. It is also able to receive communications from the memory BIST controller 40 that tell it when the memory BIST controller has finished its testing and if there are any problems. Processor 30 could alternatively poll the BIST controller 40 when waiting for completion.

Interrupt controller 20 receives, processes and sends interrupts to both processor 30 and memory BIST controller 40. If an interrupt is received while memory BIST controller 40 is performing a testing routine on embedded memory 60 then processor 30 cannot process the interrupt as it is not allowed to access embedded memory 60 during the testing routine. However, as the memory BIST controller 40 has received the interrupt in parallel with the processor it can immediately act to terminate the testing routine and restore the contents of the embedded memory 60 to its original content such that the processor can proceed to process the interrupt. Providing the interrupt to the memory BIST controller 40 in parallel with the processor allows it to act immediately on this interrupt and thereby reduces the latency period between the processor receiving the interrupt and being able to act on it.

The way in which the memory BIST controller 40 would act to restore the contents of the embedded memory 60 will depend on the type of testing routine or algorithm that is running.

It should be noted that in this embodiment, the processor 30 is shown as a microprocessor, however, it could be a number of things that are able to handle system events such as interrupts and could be for example application specific logic.

Figures 2, 3:
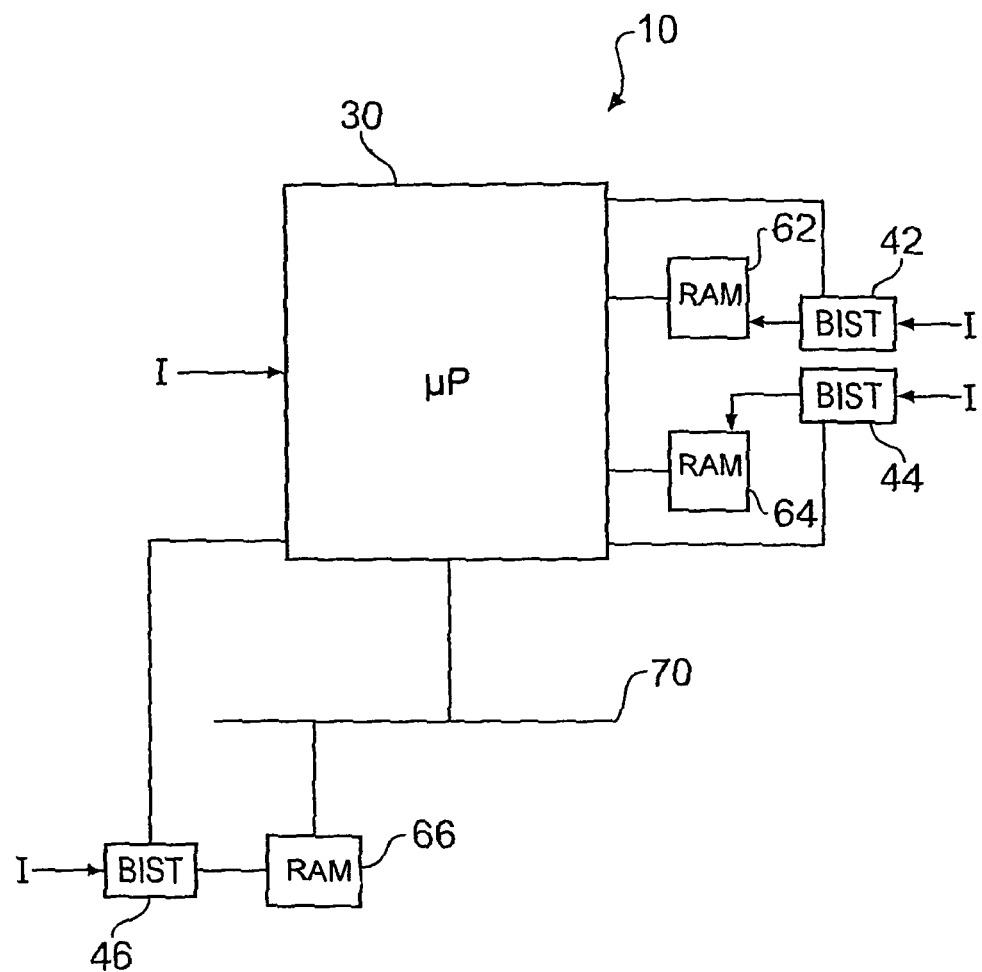
FIG. 2 schematically shows a data processing apparatus.
FIG. 3 shows a transparent march algorithm used as a testing routine.

FIG. 2 shows a further embodiment. In this embodiment there are a plurality of memories 62, 64 and 66 that processor 30 communicates with. Some of them are remote from the processor and are accessed by a bus 70. Each of the memories has a corresponding memory BIST controller 42, 44 and 46. Each of these memory BIST controllers is able to receive any interrupt that is received by processor 30. The controllers 42, 44, 46 are also connected to processor 30 so that they can communicate with the processor and receive information such as when to start their testing procedures. These memory BIST controllers may be on the same integrated circuit as the processor or they may be remote from it. Furthermore, the memories may be on the same integrated circuit as the processor or they may be off chip.

FIG. 3 shows a transparent march algorithm that can be performed.

March algorithms access each address in a memory sequentially, from the first address to the last address or vice versa. The arrow in the diagram shows whether the access procedure is going from top to bottom or bottom to top of the memory. A typical algorithm will sequentially access all the addresses in the memory several times, performing a different pattern of read and write on each pass. Owing to the sequential nature of the access, restoration of the memory to its original state can be done by performing a similar inverse pattern of accesses. March algorithms typically use the contents of the memories when the test starts as seed data this data can optionally be inverted on each write to ensure a zero and 1 could be written to and read from each address. Transparent march algorithms always use the data of the memory as seed data as they are by their nature able to restore the content of the memory without having saved the original data. As data of the memory is used as the initial data it is easy to restore the state of the memory however cyclical redundancy checks (CRC) on the data before and after the algorithm is performed need to be performed to verify the integrity of the data.

In the algorithm shown rd relates to reading the initial data from the memory, while r/d relates to the inverse of the initial data. Similarly wd relates to writing the initial data to the memory, while w/d relates to writing the inverse of the initial data.

The nature of transparent march algorithms such as the one illustrated means that in any given time one of the followings operations will restore the content of the memory to the initial state in the shortest time possible:

Invert all addresses below the current address being accessed by the algorithm.

Invert all addresses above the current address being accessed by the algorithm.

End when memory has correct data.

With regard to the final option, the algorithms are such that at certain points the data in the memory may be the same as the data at the start of the test. This is generally after a write data or wd instruction. Thus, the memory testing logic can detect when such an event happens in the algorithm and stop the testing routine at this point.

Alternatively, such positions in the algorithm can be marked within the algorithms. In the figure illustrated, an M is used to mark such positions. The testing logic will detect this indicator and stop the algorithm at this point. This will ensure that the memory is in the correct state when the processor accesses it again.

It should be noted that the appropriate action to take can be determined in the case of transparent march algorithms from a knowledge of the algorithm itself and the current position in the algorithm. As the operations to restore content are typical of operations performed by a BIST controller during a testing routine, they require very little additional logic to implement.

Figure 4:
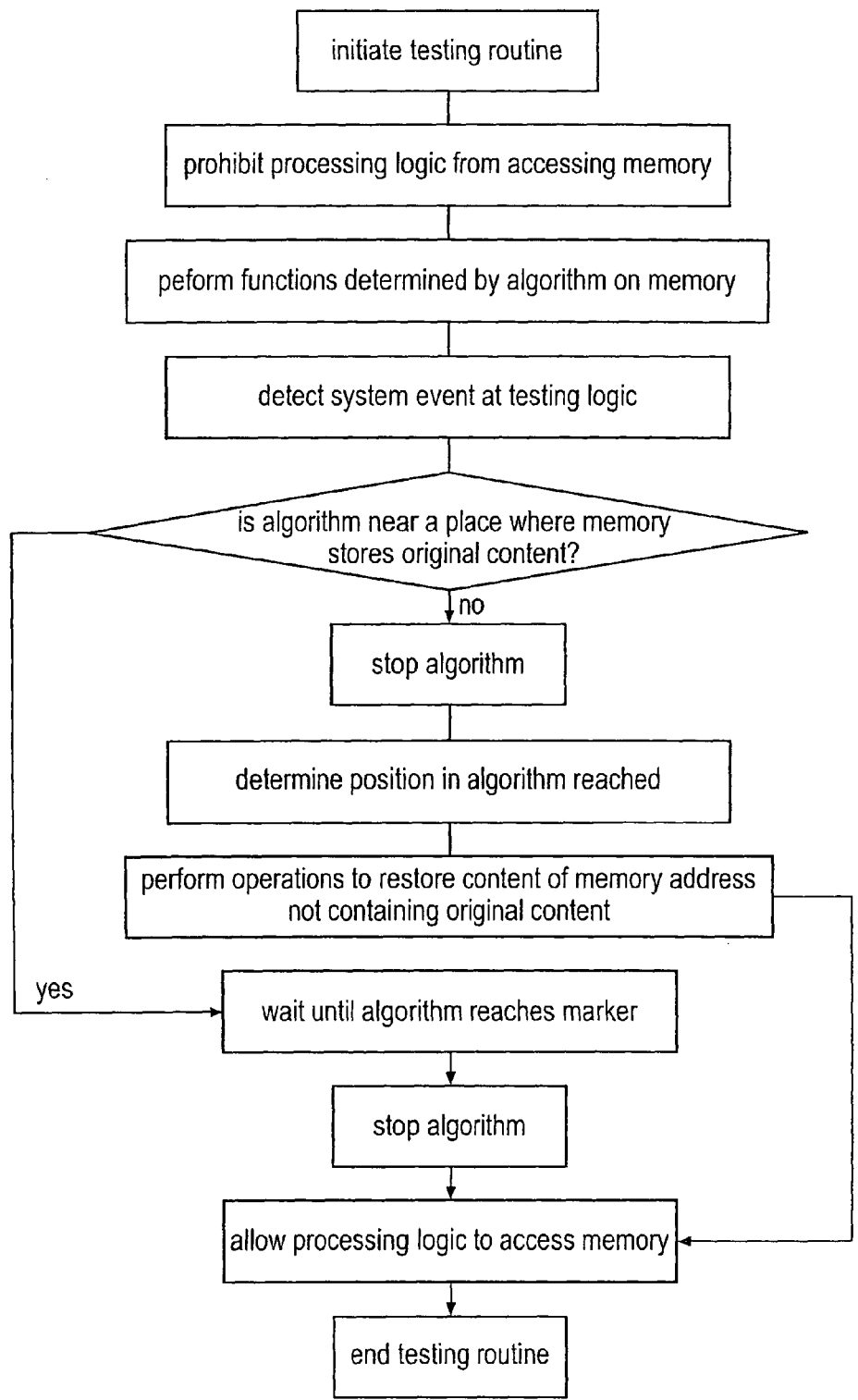
FIG. 4 shows a flow diagram illustrating the steps of a method.

FIG. 4 shows a flow diagram illustrating the steps of a method. The steps of this method could be performed under control of a software program executed on a computer.

The first step is the initiation of the testing routine. At this point the processing logic is prohibited from accessing the memory being tested. The testing algorithm is then started and data is written to and read from the memory in a manner determined by the algorithm. This tests that all addresses of the memory are still functioning correctly. If a system event is detected by the testing logic, in some embodiments a determination may then be made as to whether the algorithm is at a position close to a point where the content of the memory is as it was at the start of the testing procedure or not. If it is then the testing logic may allow the algorithm to continue up to this point whereupon the algorithm will be stopped. If it is not then the algorithm is stopped immediately and the testing logic determines the position reached in the algorithm. From this information it can determine which addresses contain original content data and which addresses contain other data. Operations are then performed to change the other data to the original data, generally by inverting it. If the algorithm was a march algorithm then all the addresses either above or below the position reached will need their data amending while the others will not. This inverting of data in a number of subsequent storage locations is a procedure often performed during a march algorithm and thus, the testing logic is well adapted to perform such an operation.

Once the state of the memory has been restored to its original state, the processing logic is allowed to access the memory again and the testing routine is ended. It is at this point that the processing logic can deal with the detected system event itself.

Although illustrative embodiments have been described in detail herein with reference to the accompanying drawings, it is to be understood that the claims are not limited to those precise embodiments, and that various changes and modifications can be effected therein by one skilled in the art without departing from the scope of the appended claims.

I claim:

1. A data processing apparatus comprising:
(i) at least one memory;
(ii) processing logic configured to perform data processing operations on data and configured to access said at least one memory; and
(iii) memory testing logic configured to perform a transparent algorithm testing routine on said at least one memory, said data processing apparatus impeding said processing logic from accessing said at least one memory while said memory testing logic is performing said transparent algorithm testing routine; wherein
(iv) said processing logic and said memory testing logic are configured to detect a system event, said memory testing logic being operable when performing said transparent algorithm testing routine to respond to detection of said system event by stopping said transparent algorithm testing routine and restoring said at least one memory to an initial state, said initial state being a state it was in immediately prior to commencement of said transparent algorithm testing routine, whereupon after restoring said at least one memory to said initial state said data processing apparatus is configured to allow said processing logic to access said at least one memory and to proceed to process said detected system event.

2. A data processing apparatus according to claim 1, wherein said processing logic is a processor.

3. A data processing apparatus according to claim 1, wherein said processing logic is application specific logic.

4. A data processing apparatus according to claim 1, wherein said testing logic is configured to detect a point during performance of said transparent algorithm testing routine where said at least one memory is in said initial state and to stop performance of said transparent algorithm testing routine at this point.

5. A data processing apparatus according to claim 4, wherein said transparent algorithm testing routine comprises indicators indicating a point in said transparent algorithm testing routine when said at least one memory will be in said initial state, said memory testing logic being configured to detect said indicators and to stop performance of said transparent algorithm testing routine in response to said detection.

6. A data processing apparatus according to claim 1, wherein said memory testing logic is operable in response to detection of said system event to detect where in performing said transparent algorithm testing routine said memory testing logic is, and to determine a way to restore said initial state of said at least one memory from this point and to restore said initial state by said determined way.

7. A data processing apparatus according to claim 1, wherein said processing logic and said at least one memory are formed on an integrated circuit.

8. A data processing apparatus according to claim 7, wherein said memory testing logic comprises a memory built in self test controller.

9. A data processing apparatus according to claim 8, wherein said memory built in self test controller is formed on said integrated circuit.

10. A data processing apparatus according to claim 1, wherein said system event comprises an interrupt.

11. A data processing apparatus according to claim 1, wherein said processing logic and said memory testing logic are configured to receive said system event in parallel with each other.

12. A method of testing at least one memory within a data processing apparatus, said data processing apparatus comprising processing logic configured to access said at least one memory, said method comprising the steps of:
  (i) initiating a transparent algorithm testing routine for testing said at least one memory;
  (ii) prohibiting said processing logic from accessing said at least one memory while said transparent algorithm testing routine is being performed;
  (iii) detecting a system event;
  (iv) stopping said transparent algorithm testing routine in response to said detected system event;
  (v) restoring said at least one memory to an initial state, said initial state being a state it was in immediately prior to commencement of said transparent algorithm testing routine; and
  (vi) after restoring said at least one memory to said initial state, allowing said processing logic to access said at least one memory and to proceed to process said detected system event.

13. A method according to claim 12, wherein said steps of stopping said transparent algorithm testing routine and restoring said at least one memory to an initial state comprise detecting a point during performance of said transparent algorithm testing routine where said at least one memory is in said initial state and stopping performance of said transparent algorithm testing routine at this point.

14. A method according to claim 12, wherein said transparent algorithm testing routine comprises indicators indicating a point in said algorithm when said memory will be in said initial state, said steps of stopping said transparent algorithm testing routine and restoring said at least one memory to an initial state comprises detecting said indicators and stopping performance of said transparent algorithm testing routine in response to said detection of said indicators.

15. A non-transistory, tangible computer program product stored on a tangible storage medium which is operable when run on a data processor to control the data processor to perform the steps of the method according to claim 12.

* * * * *